US008631359B1

(12) United States Patent  (10) Patent No.: US 8,631,359 B1
Huang et al.  (45) Date of Patent: Jan. 14, 2014

(54) SYSTEM AND TECHNIQUE FOR MODELING RESIST PROFILE CHANGE SENSITIVITY AT DIFFERENT HEIGHTS

(75) Inventors: Jensheng Huang, San Jose, CA (US); Xin Zheng, Sunnyvale, CA (US); Chun-Chieh Kuo, Hsinchu (TW)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/569,162

(22) Filed: Aug. 7, 2012

(51) Int. Cl.
 *G06F 17/50* (2006.01)
(52) U.S. Cl.
 USPC .............................................. 716/51; 716/54
(58) Field of Classification Search
 None
 See application file for complete search history.

(56) References Cited

U.S. PATENT DOCUMENTS

| | | | |
|---|---|---|---|
| 7,454,739 B2 | 11/2008 | Huang et al. | |
| 7,727,687 B2 | 6/2010 | Melvin, III et al. | |
| 7,743,357 B2 * | 6/2010 | Huang et al. | 716/50 |
| 7,747,978 B2 * | 6/2010 | Ye et al. | 716/50 |
| 7,921,383 B1 * | 4/2011 | Wei | 716/54 |
| 8,250,498 B2 | 8/2012 | Huang et al. | |
| 2007/0282574 A1 | 12/2007 | Huang et al. | |
| 2007/0283312 A1 | 12/2007 | Huang et al. | |
| 2013/0185045 A1 * | 7/2013 | Bagheri et al. | 703/14 |

OTHER PUBLICATIONS

Mack, "A New Fast Resist Model: the Gaussian LPM," Proc. of SPIE, vol. 7974, 2011, 6 pages.*
Smith et al., "A Comparison between the Process Windows calculated with Full and Simplified Resis Models," Proc. of SPIE, vol. 4691, 2002, pp. 1199-1210.*
Zheng et al., "Chemically Amplified Resist Modeling in OPC," Proc. of SPIE, vol. 7974, 2011, 8 pages.*
Ahn et al., "A Novel Approximate Model for Resist Process," SPIE vol. 3334, pp. 754-763, no date.*
Byers, Jeffrey, et al.: "3D Lumped Parameter Model for Lithographic Simulations", Optical Microlithography XV, Anthony Yen, Ed., Proceedings of SPIE, vol. 4691, 2002, pp. 125-137.
Byers, Jeffrey, et al.: "Lumped Parameter Model for Chemically Amplified Resists", Optical Microlithography XVII, Bruce W. Smith, Ed., Proceedings of SPIE, vol. 5377, 2004, pp. 1462-1474.
Shim, Seongbo, et al.: "Physical Simulation for Verification and OPC on Full Chip Level", Optical Microlithography XXIV, Mircea V. Dusa, Ed., Proceedings of SPIE, vol. 7973, 2011, 79732I (9 pages).

* cited by examiner

*Primary Examiner* — Leigh Garbowski
(74) *Attorney, Agent, or Firm* — Bever, Hoffman & Harms, LLP; Jeanette S. Harms

(57) ABSTRACT

A method of calibrating a compact model for a lithographic process is described. In this method, the nominal compact model can be provided. Notably, an input energy effect can be separated from chemical effects and other factors regarding the photoresist. Using a processor, the compact model can be calibrated based on the input energy, thereby generating an energy-sensitive compact model. The energy-sensitive compact model can quickly construct 3D resist profiles capturing resist profile degradation at any horizontal plane. Because this method does not change any form of compact modeling, it can be integrated as is into validation and correction processes. In other embodiments, the energy-sensitive compact model can be further calibrated based on one or more of the chemical effects and/or other factors.

19 Claims, 8 Drawing Sheets

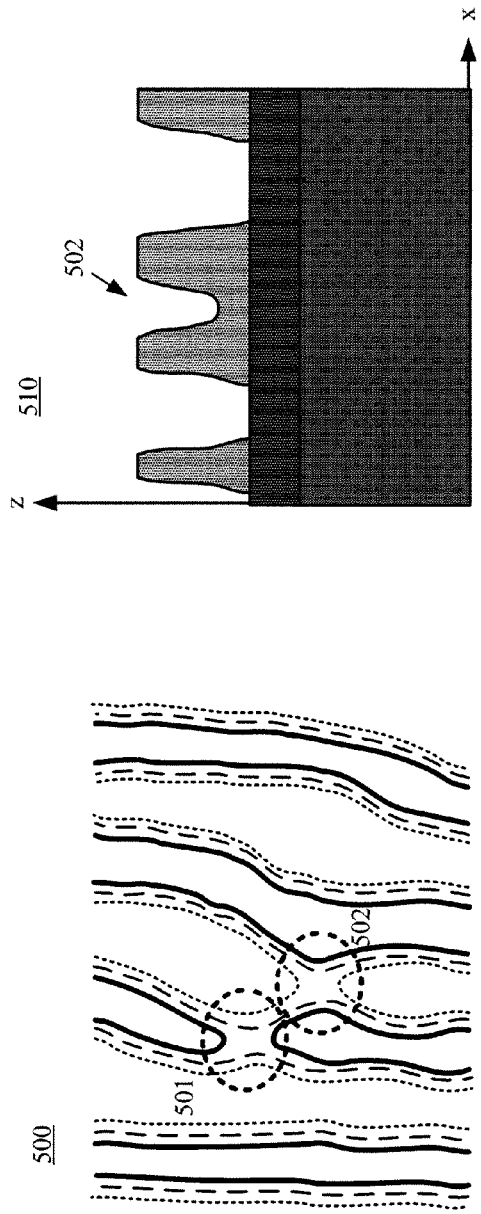
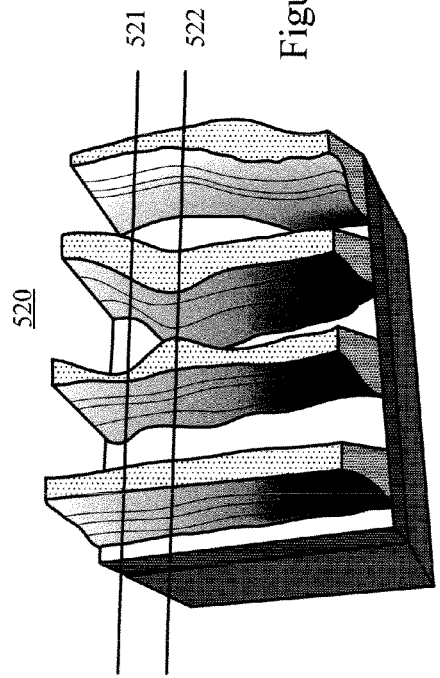
Figure 5A
Figure 5B
Figure 5C

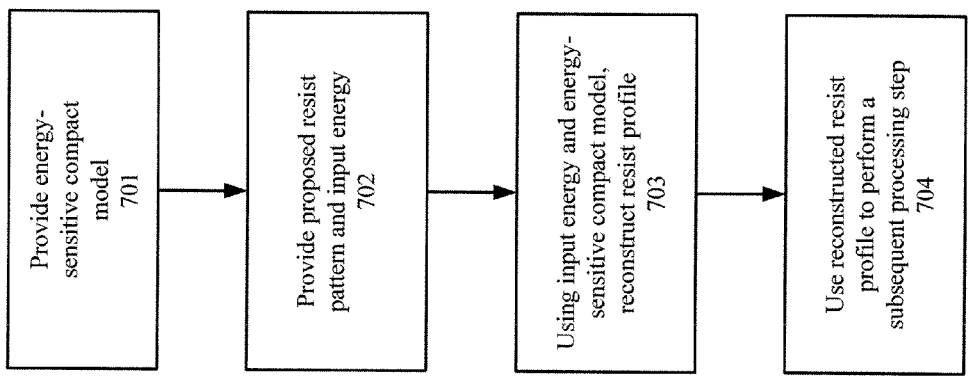

SYSTEM AND TECHNIQUE FOR MODELING RESIST PROFILE CHANGE SENSITIVITY AT DIFFERENT HEIGHTS

BACKGROUND OF THE DESCRIPTION

1. Field of the Description

An enhanced modeling capability to predict photoresist (resist) profiles at any plane is described herein. This enhanced modeling capability addresses exposure energy separately from other factors, e.g. chemical effects of the resist.

2. Related Art

The resolution of optical projection lithography is generally described using Rayleigh's formula:

$$R=k_1 * \lambda/NA$$

where $\lambda$ is the exposure wavelength, NA is the numerical aperture of the projection optics, and $k_1$ is a constant depending on the lithographic process. As $k_1$ decreases, the lithographic process becomes more difficult. Low $k_1$ lithography (typically below 0.35) can result in pattern fidelity degradation, a narrow process window, and increased sensitivity to process variation. With a steadily shrinking $k_1$ factor in advancing patterning technology generations, the benefit of photolithographic enhancement using Optical Proximity Correction (OPC) to compensate for imaging errors from diffraction and process effects is facing the challenge of an undesirable shrinking Usable Depth of Focus (UDOF).

To date, simulation for OPC model calibration has been conducted at a single image depth (single focus plane) in a process stack (e.g. resist, top/bottom anti-reflective coatings, hard mask) with a silicon substrate. Specifically, OPC only focuses on rendering the design result at the bottom of the resist (where wafer measurements are taken and then used for compact model calibration). As a result, any topography variation along the z direction in OPC has been ignored. Unfortunately, this simplistic approach can cause the predicted resist image to lose awareness of its full patterning integrity due to Resist Top Loss (RTL) or unacceptable Side-Wall Angles (SWA), thereby making it susceptible to failure upon etch. Note that the RTL is a relative term that describes the loss of height/depth of the photoresist.

For example, FIGS. 1A and 1B illustrate cross-sectional views of various features patterned in a resist layer 101, wherein some of those features exhibit relative RTL and unacceptable SWA. Specifically, FIG. 1A shows a feature 102 that has a top loss 103 (relative to an expected "top" 105) and an unacceptable SWA 104, whereas FIG. 1B shows a feature 112 that has a top loss 113 (relative to an expected "top" 114). When patterned resist layer 101 is subjected to etching, features 102 and 112 may cause an undesirable or unexpected patterning of the underlying layer 100. Unfortunately, as indicated above, neither RTL nor SWA information is currently collected by a conventional top-down SEM (Scanning Electron Microscope) metrology.

Complex patterning schemes and shrinking process margins, which are both inherent in low $k_1$ processes, need more sophisticated verification checks. These more sophisticated verification checks may require traditional compact lithographic models to be augmented with information from rigorous models, which include 3-D descriptions of process behavior. However, the use of such rigorous models would take a significant amount of time. For example, using rigorous models for full-chip simulation on a 45 nm layer is estimated to take a commercial software tool approximately 3000 years on one CPU to complete. Thus, the TurnAround Time (TAT) of using rigorous models for full layout OPC and validation applications is unacceptable for commercial use.

Therefore, a need arises for an enhanced compact model that provides accurate resist profile information while ensuring a commercially reasonable run time.

SUMMARY

A method of calibrating a compact model for a lithography process is described. In this method, input energy effect can be separated from chemical effects and other factors regarding the photoresist. The calibrated compact model can then extrapolate and export energy-sensitive contour predictions for different heights in the resist. In other embodiments, the energy-sensitive compact model can be further calibrated based on one or more of the chemical effects and/or other factors. The chemical effects can include whether the photoresist is positive resist or negative resist and whether chemical amplification is used. The other factors can include a usable depth of focus, whether soft-bake is performed, whether post-exposure bake is performed, and a rate of solvent evaporation.

A non-transitory, computer-readable medium storing computer-executable instructions for calibrating a compact model for a lithography process is also described. These instructions, when executed by a processor, can perform the above steps. A system including a processor is also described. This processor can be configured to perform the above steps.

A method of using an energy-sensitive compact model for a lithography process is also described. This energy-sensitive compact model was calibrated separately for an input energy effect and chemical effects for a photoresist. In this method, the energy-sensitive compact model can be provided. The input energy and the energy-sensitive compact model can be used to reconstruct the photoresist profile. In one embodiment, the reconstructed photoresist profile can be used to perform a subsequent processing step, such as identifying regions exhibiting unacceptable resist top loss or sidewall angle, providing area identification information to facilitate rigorous modeling or generating Critical Dimension Scanning Electron Microscope (CDSEM) images, or forming a three-dimensional image.

The above-described energy-sensitive compact modeling can provide distinct advantages with regard to process window modeling, 3D compact modeling, standing wave and sidewall modeling, noise control, and integration. For example, process window calibration including accurate profile sensitivity to energy can advantageously generate a more accurate process window model. Moreover, process window OPC integration has no overhead time or cost when adapting energy-sensitive modeling. Additionally, OPC can be advantageously expanded from 2D-horizontal (in which only a bottom plane is shown) to 3D-horizontal-plus-vertical (in which two or more planes of the resist can be shown), thereby allowing identification of resist height, resist loss, and its sidewall angles. 3D OPC can significantly lessen the current requirement for overlay accuracy between layers and reduce the gap between measurement accuracy and metrology limitation. Therefore, 3D OPC may provide significantly improved yield compared to 2D OPC. The above-described energy-sensitive compact model can also expand the scope of mask synthesis capabilities from 2D to 3D, thereby providing better physical descriptions to be used for follow-up deposition and/or etching for device simulations. In one embodiment, both the number of standing waves and their relative energy difference can be modeled and deployed for OPC applications in energy-sensitive compact modeling. Moreover, using the capability of predicting feature width at different resist heights, sidewall angles can be calculated for different features, thereby allowing etch resistance to be determined in downstream processing. Energy-sensitive compact modeling can also be used to retro-validate measurements for features that have poor sidewall angles (which would otherwise result in high metrology noise). The energy-sensitive compact model can reliably and non-destructively predict resist opening widths, thereby providing advantages over conventional measurement techniques (performed at the bottom of resist) as well as top-down SEM. The energy-sensitive compact model can also provide integration benefits by allowing seamless adaptation of RTL models in downstream tools (correction and validation). Due to TAT concern, RTL modeling provides a workable flow to deploy rigorous simulation in production by using compact modeling to isolate hotspots, followed by rigorous modeling to validate. Due to limited resolution and its UDOF, the resist loss issue exists in all processes. Advantageously, the energy-sensitive compact model can deploy RTL modeling for all nodes, e.g. from 130 nm down to 15 nm node and smaller.

BRIEF DESCRIPTION OF THE DRAWINGS

FIG. 5A illustrates one exemplary energy-sensitive compact modeling image that includes three planes: top, middle, and bottom.

FIG. 5B shows a cross-section of the resist shown in FIG. 5A and its underlying layers generated by a rigorous model.

FIG. 5C illustrates a tilted, 3D image of the four corresponding resist lines of FIG. 5A generated by a rigorous model.

FIG. 6 illustrates an exemplary technique for calibrating an energy-sensitive compact model.

FIG. 7 illustrates an exemplary technique for using the energy-sensitive compact model.

DETAILED DESCRIPTION OF THE DRAWINGS

Modeling RTL (resist top loss) and SWAs (sidewall angles) at different planes (i.e. heights) of the resist in a compact model becomes highly desirable for advanced node (e.g. 28 nm and below) processes. In accordance with one aspect of an enhanced compact model, exposure energy is separately addressed from other factors, e.g. chemical effects. As a result, the enhanced compact model is called an energy-sensitive compact model herein.

In one embodiment, regions identified by the energy-sensitive compact model as exhibiting unacceptable RTL or SWAs can be passed to rigorous models for simulation. In another embodiment, the energy-sensitive compact model can include various levels of modeling, e.g. more sophisticated rigorous models to take into account the vertical profile of the resist while using simplified rigorous models for the horizontal profile to increase system speed at a minimal price of accuracy. In yet another embodiment, the energy-sensitive compact model can further include a Process Window Aware (PWA) OPC scheme.

Figures 1A, 1B:
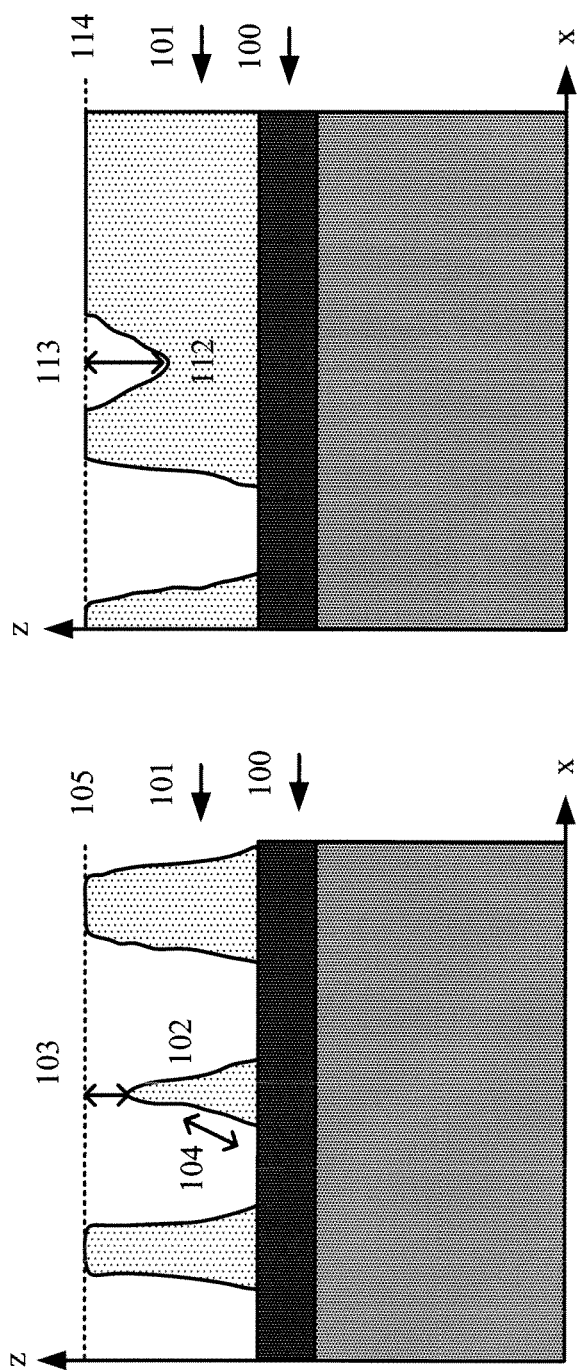
FIGS. 1A and 1B illustrate cross-sectional views of various features patterned in a resist layer, wherein some of those features exhibit relative RTL and unacceptable SWA.
Figures 2A, 2B:
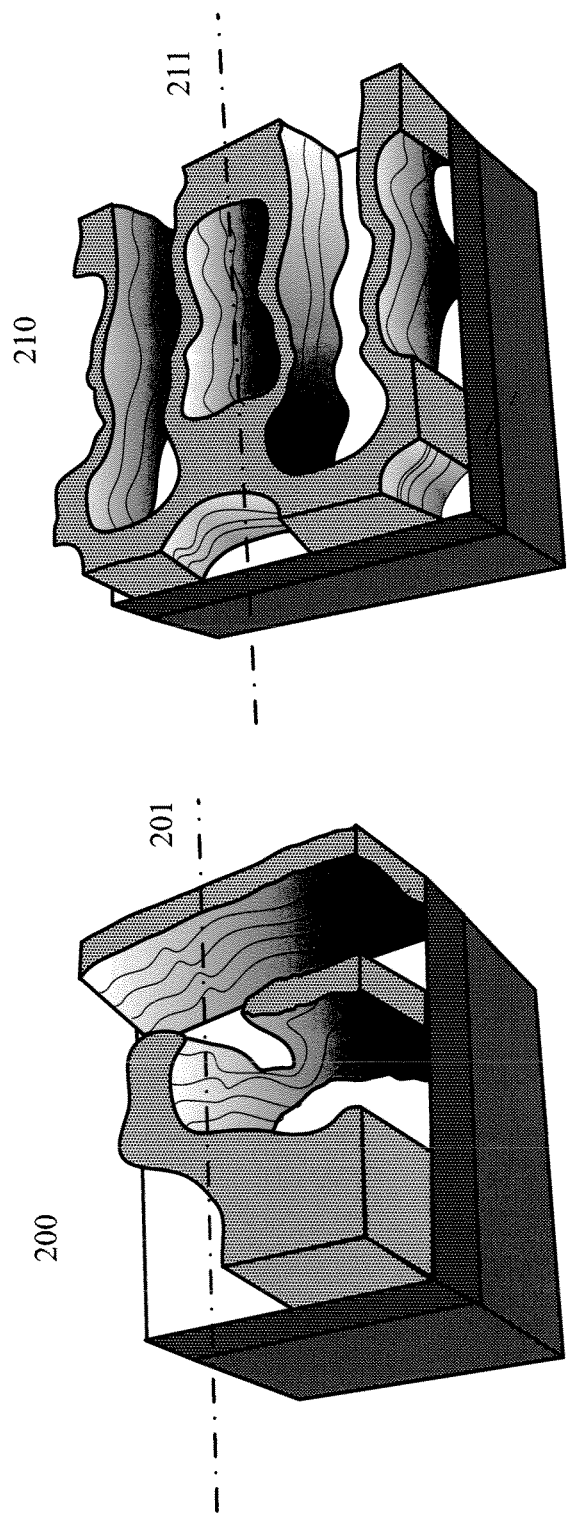
FIG. 2A shows a three-dimensional (3D) tilted image profile of the features in FIG. 1A.
FIG. 2B shows a 3D tilted image profile of the features in FIG. 1B.

In yet another embodiment, the energy-sensitive compact modeling can provide area identification information to facilitate generating CDSEM images. For example, FIG. 2A shows a three-dimensional (3D) tilted image profile 200 of the features in FIG. 1A (cut line 201 shown for convenience), whereas FIG. 2B shows a 3D tilted image profile 210 of the features in FIG. 1B (cut line 211 shown for convenience). Image profiles 200 and 210 can be generated by rigorous process simulation. Generating these images for a chip would not be commercially viable based on its prohibitive cost. However, generating tilted image profiles of only specific areas of the chip that exhibit unacceptable RTL or SWAs, as identified by the energy-sensitive compact model, may be commercially viable. In yet another embodiment, the profile information for multiple planes as generated by the energy-sensitive compact model can be accumulated to form 3D tilted image profiles.

Figure 3:
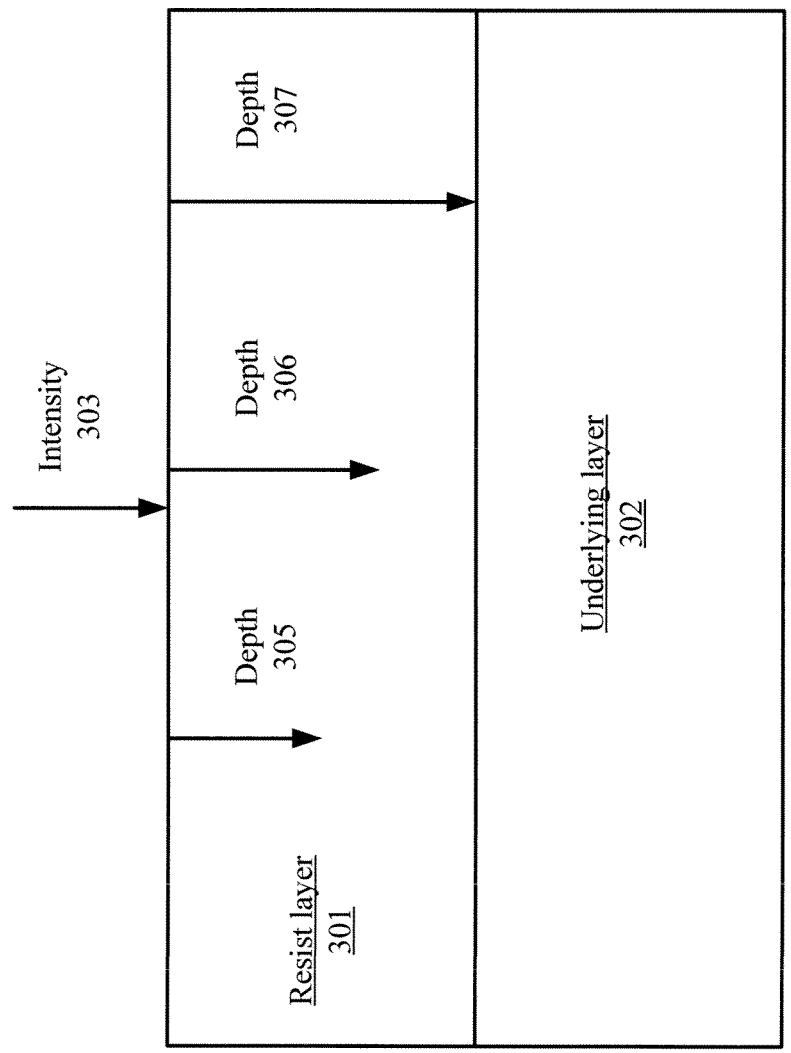
FIG. 3 shows a resist layer formed on an underlying layer.

As indicated above, an energy-sensitive compact model can be used to accurately predict resist profiles at different heights on different features. For example, FIG. 3 shows a resist layer 301 formed on an underlying layer 302 (e.g. a Bottom Anti-Reflective Coating (BARC) or another material). In the energy-sensitive compact model, an accurate resist profile can be dynamically determined for any of depths 305, 306, and 307 based on intensity 303, (measured in mW/cm$^2$, for example) or exposure energy (i.e. light intensity×time). Note that, in general, the maximum optical energy is at the top of the resist and the amount of energy found at a specific depth in the resist is less than the maximum energy and lessens as the depth increases.

In accordance with one aspect of energy-sensitive compact modeling, the energy loss between any resist depth and the resist top can be used to derive the percentage of lost resist. For example, the following relationship can be used to indicate the percentage resist loss of the resist at its center thickness:

$$P_{lost\_percentage} \propto (E_{PR\_top} - E_{PR\_center})/E_{PR\_top}$$

wherein $E_{PR\_top}$ is the energy measured at the top of the resist and $E_{PR\_center}$ is the energy measured at the center of the resist (thus, the division algorithm provides a normalized value). Note that the energy at any depth of the resist (instead of $E_{PR\_center}$) can be used to determine its corresponding, proportional resist lost percentage at that depth. Thus, in general, $P_{lost\_percentage}$ is a first principle approximation to estimate the "energy loss" from the resist top to any other plane of interest.

The resist percentage lost $P_{lost\_percentage}$ can be used along with a threshold dosage value $C_0$ of a non-energy-sensitive compact model to generate a threshold value for the energy-sensitive compact model. Specifically, applying the percentage change to the model threshold dosage value $C_0$ represents the dose variation for different exposure dose models to predict a resist profile at a particular plane. For example, the model dosage threshold value can be expressed as:

$$C_{PR\_loss} = f(P_{lost\_percentage}, C_0)$$

which can also be expressed as:

$$C_{PR\_loss} = (1 - P_{lost\_percentage})$$

That is, the corresponding effect of $C_0$ is proportionally determined by the energy loss percentage. Therefore, the threshold of the loss would be the complement of the energy loss percentage (i.e. $1-P_{lost\_percentage}$) multiplied by $C_0$. The model dosage threshold value $C_{PR\_loss}$ can advantageously provide the adjustment "knob" in the code of the compact model for energy loss.

In energy-sensitive compact modeling, the exposure energy can be addressed separately from the resist chemical effects and other factors. This separation avoids calibrating different final resist thickness for different features because the same enhanced compact model can be used to accurately predict resist critical dimensions at different heights for different features.

Figure 4B:
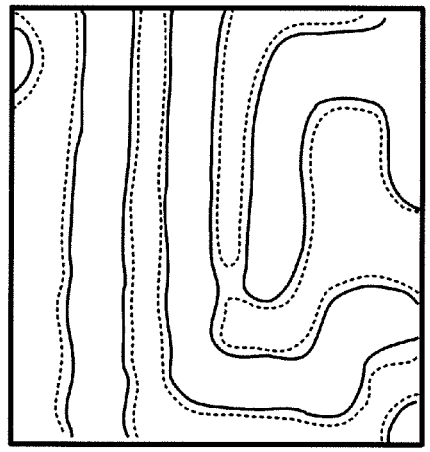
FIG. 4B illustrates bottom contours and top contours generated by a rigorous modeling tool for the same patterned resist as FIG. 4A.
Figure 4A:
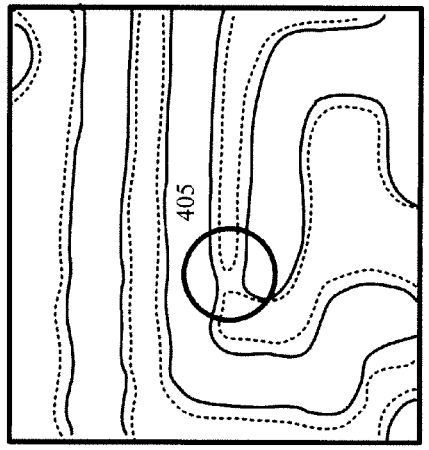
FIG. 4A illustrates bottom contours and top contours generated by energy-sensitive compact modeling for an exemplary patterned resist.
Figure 4C:
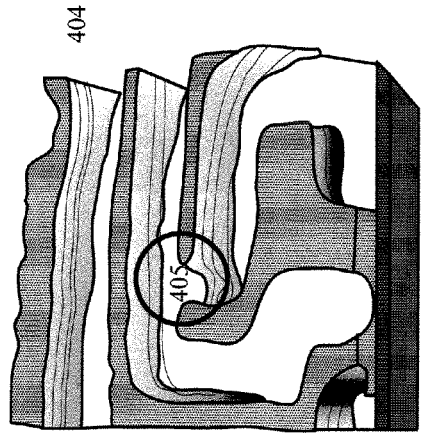
FIG. 4C illustrates a tilted, 3D image of contours generated by a rigorous modeling tool.

FIG. 4A illustrates contours 401, specifically bottom contours (solid lines) and top contours (dotted lines) generated by energy-sensitive compact modeling for an exemplary patterned resist. FIG. 4B illustrates contours 402, specifically bottom contours (solid lines) and top contours (dotted lines) generated by a rigorous modeling tool for the same patterned resist as FIG. 4A. As demonstrated by comparing FIGS. 4A and 4B, contours 401 generated by the energy-sensitive compact modeling show a good match at severe resist lost areas, with small line width differences between the rigorous modeling tool and energy-sensitive compact modeling. FIG. 4C illustrates a tilted, 3D image 404 of contours generated by a rigorous modeling tool. A pinching area 405 captured by image 404 is also clearly shown by contours 401 in FIG. 4A. Thus, by using the energy-sensitive compact model, resist profile degradation (which can be significant under limited UDOF, but is ignored in conventional OPC modeling and mask patterning) can be determined. (Note that SEM can only show the pinching trend to some extent.) Moreover, compared to rigorous modeling solutions, energy-sensitive compact modeling has no TAT increase.

In one embodiment of energy-sensitive compact modeling, intermediate planes of the resist can also be analyzed. For example, FIG. 5A illustrates one exemplary energy-sensitive compact modeling image 500 that includes three planes: top (solid lines), middle (dashed lines), and bottom (dotted lines). As shown in FIG. 5A, all lines exhibit pinching at the top (noting that all four lines have wider bottoms than tops). Moreover, two hotspots (i.e. areas exhibiting significant lithographic deviations from a standard shape) 501 and 502 in image 500 provide further helpful information. Specifically, hotspot 501 indicates an area of significant RTL that has not reached the middle plane. Additionally, hotspot 502 indicates an area where most of the resist height is lost.

FIG. 5B shows a cross-section 510 of the resist shown in FIG. 5A and its underlying layers generated by a rigorous model. Note that cross-section 510 can identify hotspot 502, but is not able to simultaneously identify hotspot 501. FIG. 5C illustrates a tilted, 3D image 520 of the four corresponding resist lines of FIG. 5A generated by a rigorous model. Image 520 can identify hotspot 501 (see cut-line 521) and hotspot 502 (see cut-line 522). Although both Atomic Force Microscopy (AFM) and SEM can be used for rigorous model calibration, the effort for such data collection on massive gauges used in compact model is prodigious. Therefore, the energy-sensitive compact model can provide significant advantages over rigorous modeling when taking into account system resources.

In one embodiment, even more accurate calibration of $P_{lost\_percentage}$ can be done by taking into account the refractive index (n) and the extinction coefficient (k) of layers below and above the resist through mathematical expressions. For example, the usable depth of focus (UDOF) in OPC can be defined as:

$$UDOF = \frac{k_2 * n_{media} * \lambda}{NA^2}$$

where $k_2$ is a constant depending on the lithographic process, $n_{media}$ is the refractive index of the layer being patterned, $\lambda$ is the exposure wavelength, and NA is the numerical aperture of the projection optics. The UDOF is the amount by which the separation between the wafer and the lens can be changed and line widths and resist profiles remain adequate throughout the exposure field. This UDOF information can be included in compact model calibration, along with calculating the resist's chemical effect and exposure energy or dose.

The chemical effect includes, for example, the use of positive resist or negative resist. In positive resist, photon interaction with the resist results in bond scission. Therefore, positive resist becomes soluble in the developer. As a result, positive resist is exposed to light where the underlying material is to be removed. In contrast, in negative resist, photon interaction with the resist results in cross-linking. Therefore, exposure to light causes negative resist to become polymerized and thus more difficult to dissolve (wherein unexposed negative resist areas become soluble in the developer). As a result, negative resist is exposed to light where the underlying material is to be retained. In one embodiment, chemical effects can further include chemical amplification, which is used to increase sensitivity to exposure dose (e.g. for electron beam exposure) or to exposure energy (particularly for Deep Ultraviolet(DUV) and shorter wavelengths).

In one embodiment, other factors can also be taken into account for energy-sensitive compact modeling. Exemplary other factors to consider include, but are not limited to, soft-bake, PEB (Post-Exposure Bake), and/or solvent evaporation. Soft-bake is performed after resist coating, but before exposure, to substantially remove residual solvents from the resist coating. A typical soft-bake is performed at 100° C. for 1 min per µm resist thickness. PEB is performed after exposure, but before development, to ensure completion of the photo reaction (particularly in chemically amplified resists) or to drive diffusion of components within the resist. A typical PEB is performed at 110° C. for 1-2 min. Solvent evaporation can occur even at standard temperatures, i.e. without heating due to soft-bake or PEB.

In accordance with one embodiment of an energy-sensitive compact model, the energy loss within the resist due to absorption and reflection along the vertical profile of the resist can also be determined. For example, assuming an incident light intensity is "1", then the absorption at the bottom of the resist (at a depth d1) can be defined as:

$$absorption(d1) = \exp(-4*\pi*k*d1/\lambda)$$

Therefore, at any depth d in the resist:

$$absorption(d) = \exp(-4*\pi*k*d/\lambda) = absorption(d1)^{(d/d1)}$$

where k is the extinction coefficient of the resist (which is distinguished from $k_1$, the constant of Rayleigh's formula).

The reflection from the bottom of the resist can be defined as:

$$\text{reflection} = ((n1-n2)/(n1+n2))^2$$

where n1 is the refractive index of the resist and n2 is the refractive index of the underlying layer adjacent to the resist. The light from reflection at position d can be defined as: reflection=absorption(d1)*reflection*absorption(d1−d) As a result, the total intensity of the light at d can be defined as:

$$\text{intensity}(d) = \text{absorption}(d) + \\ \text{absorption}(d1)*\text{reflection}*\text{absorption}(d1-d)$$

Alternatively, $$\text{intensity}(d) = \text{absorption}(d) + \text{absorption}(d1)^2 * \text{reflection}/\text{absorption}(d)$$

The top to measurement plane (e.g. 90% down the resist) intensity ratio can be defined as: intensity(0)/intensity(0.9*d1). The bottom (100% down the resist) to measurement (90% down the resist) intensity ratio can be defined as: intensity(d1)/intensity(0.9*d1). The middle (50% down the resist) to measurement (90% down the resist) intensity ratio can be defined as: intensity(0.5*d1)/(0.9*d1). Note that the 0.9 can now be an actual SEM target usable in the industry, i.e. a measurement plane used for implementation. Thus, using the above equations, the intensities at different heights can be used to account for dosage. Note that it has previously been very difficult to measure the resist other than at the bottom (as used in typical 2D compact models).

To build the energy-sensitive compact model, the resist response at the bottom when applying different criteria (e.g. different exposure energy, focus change, etc.) can be used. Note that this response is a general requirement and practice for current PWA OPC modeling, which has advantages described below. Then, the translation from the bottom of the resist to other planes was built using an extrapolation of those responses. Empirical results for the calibrated compact model, as shown above in FIGS. 4A and 4B, confirm the validity of that translation.

Figure 5D:
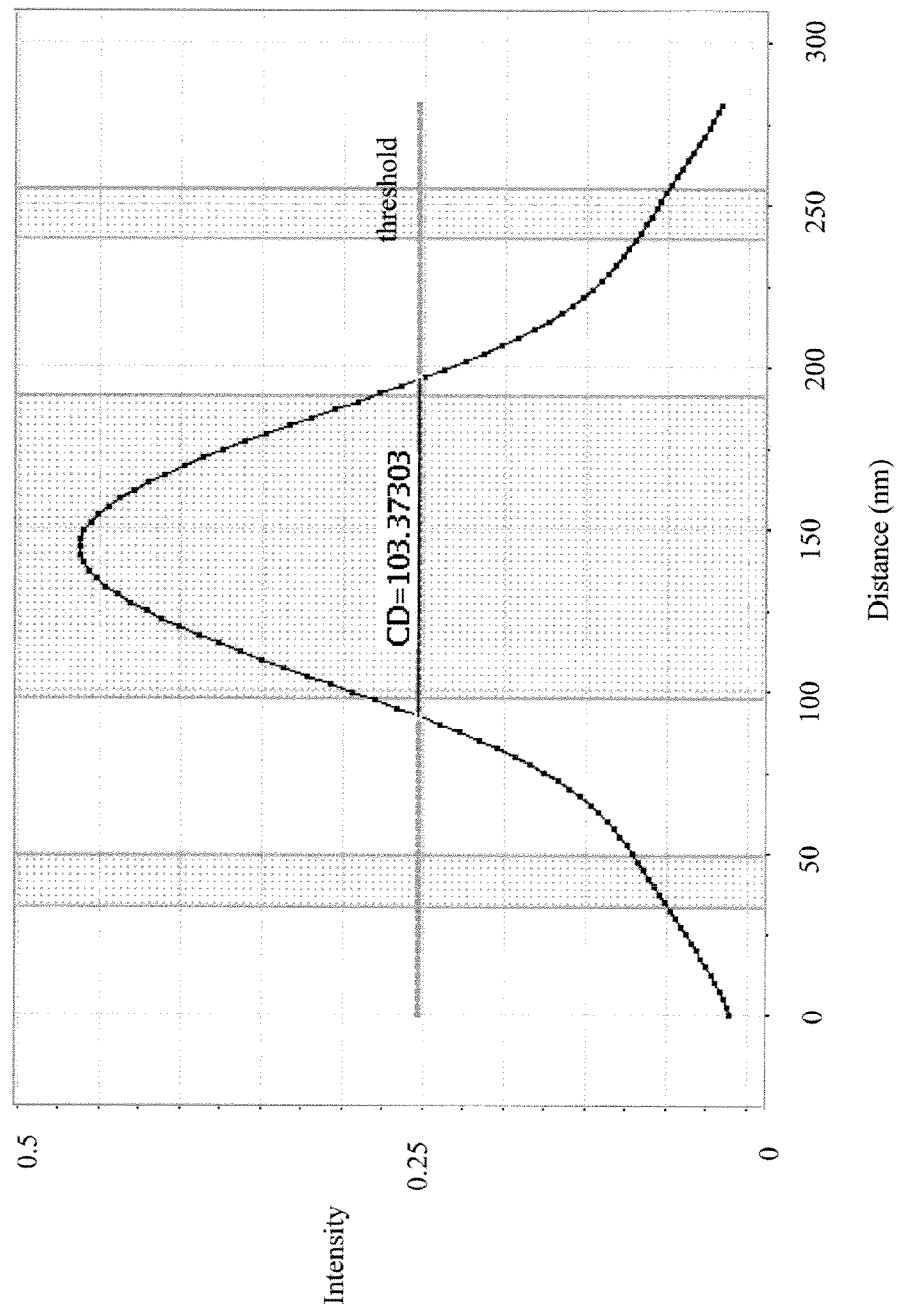
FIG. 5D illustrates an exemplary threshold cutline and intensity.

In one embodiment, the focus fidelity within the resist stack, which can affect the acid density, can also be included as a factor during compact modeling. Areas with local resist loss show local contrast loss at the resist top. In rigorous simulation, in addition to this optical effect, acid diffusion is needed to trigger resist loss. In contrast, when a compact model is used, such optical image information can be transferred into a threshold outline and intensity map. FIG. 5D illustrates an exemplary threshold outline and intensity map 530. In this map, focus changes can be taken into account when optical parameters are calibrated based on the measurement data. On the other hand, feature-dependent focus sensitivities along the resist height can be included in the energy calculation of the optical signal (which in some cases may not be inconsequential).

The above-described energy-sensitive compact modeling can provide distinct advantages with regard to process window modeling, 3D compact modeling, standing wave and sidewall modeling, noise control, and integration.

In process window modeling, PW measurement is a critical requirement for calibration. Resist loss in any PW condition is a combination of focus change, dose change, and resist height. PW calibration including resist profile awareness can advantageously generate more accurate PW model. Notably, PW OPC integration has no overhead time or cost when adapting this method.

OPC can be advantageously expanded from 2D-horizontal (in which only a bottom plane is shown) to 3D-horizontal-plus-vertical (in which two or more planes of the resist can be shown), thereby allowing identification of resist height, resist loss, and its sidewall angles. 3D OPC can significantly lessen the current requirement for overlay accuracy between layers because energy-sensitive modeling provides information about multiple planes, not just the bottom plane. Moreover, 3D OPC can also reduce the gap between measurement accuracy and metrology limitation, since the required reliability of SEM measurements is likely to be compromised for features with poor sidewall angles and significant resist loss. Therefore, 3D OPC may provide significantly improved yield compared to 2D OPC. The above-described energy-sensitive compact model can also expand the scope of mask synthesis capabilities from 2D to 3D, thereby providing better physical descriptions to be used for follow-up deposition and/or etching for device simulations.

In one embodiment, both the number of standing waves and their relative energy difference can be modeled and deployed (e.g. wherein the number of standing waves minima=2d*(n/λ), where d is the resist thickness, n is the refractive index, and λ is the wavelength) for OPC applications in energy-sensitive compact modeling. Moreover, using the capability of predicting feature width at different resist heights, sidewall angles can be calculated for different features, thereby allowing etch resistance to be determined in downstream processing. Energy-sensitive compact modeling can also be used to retro-validate measurements for features that have poor sidewall angles (which would otherwise result in high metrology noise).

Measurement noise from different resist profiles and sidewall angles can affect calibrated nominal model accuracy. Previously, there was no production solution to identify discrepancies between real opening width and measured opening width for features at the bottom of the resist other than to cleave the wafer and measure cross-sectional views (which is unreliable and destructive, both undesirable). The energy-sensitive compact model can reliably and non-destructively predict resist opening widths, thereby providing advantages over conventional measurement techniques (performed at the bottom of resist) as well as top-down SEM.

The above-described energy-sensitive compact model can also provide integration benefits by allowing seamless adaptation of RTL models in downstream tools for correction and validation. Due to TAT concern, RTL modeling provides a workable flow to deploy rigorous simulation in production by using compact modeling to isolate hotspots, followed by rigorous modeling to validate. Due to limited resolution and UDOF, the resist loss issue exists in all processes. Advantageously, the energy-sensitive compact model can deploy RTL modeling for all nodes, e.g. from 130 nm down to 15 nm node and smaller.

FIG. 6 illustrates an exemplary technique 600 for calibrating a compact model. Step 601 can get the compact model. Step 602 can separate the input energy contribution to the resist from any chemical effects and other factors. Step 603 can calibrate the compact model based on the input energy. Step 604 (optional) can further calibrate the compact model based on one or more chemical effects and/or one or more other factors (described above). In one embodiment, the compact model in step 601 is already calibrated with process window awareness. In another embodiment, the compact model can be calibrated with process window awareness later in step 604.

FIG. 7 illustrates an exemplary technique 700 for using the energy-sensitive compact model. Step 701 can get the energy-sensitive compact model. Step 702 can get the proposed resist pattern and the input energy (or dose). Step 703 can reconstruct the resist profile by applying the input energy in the energy sensitive compact model.

Figure 8:
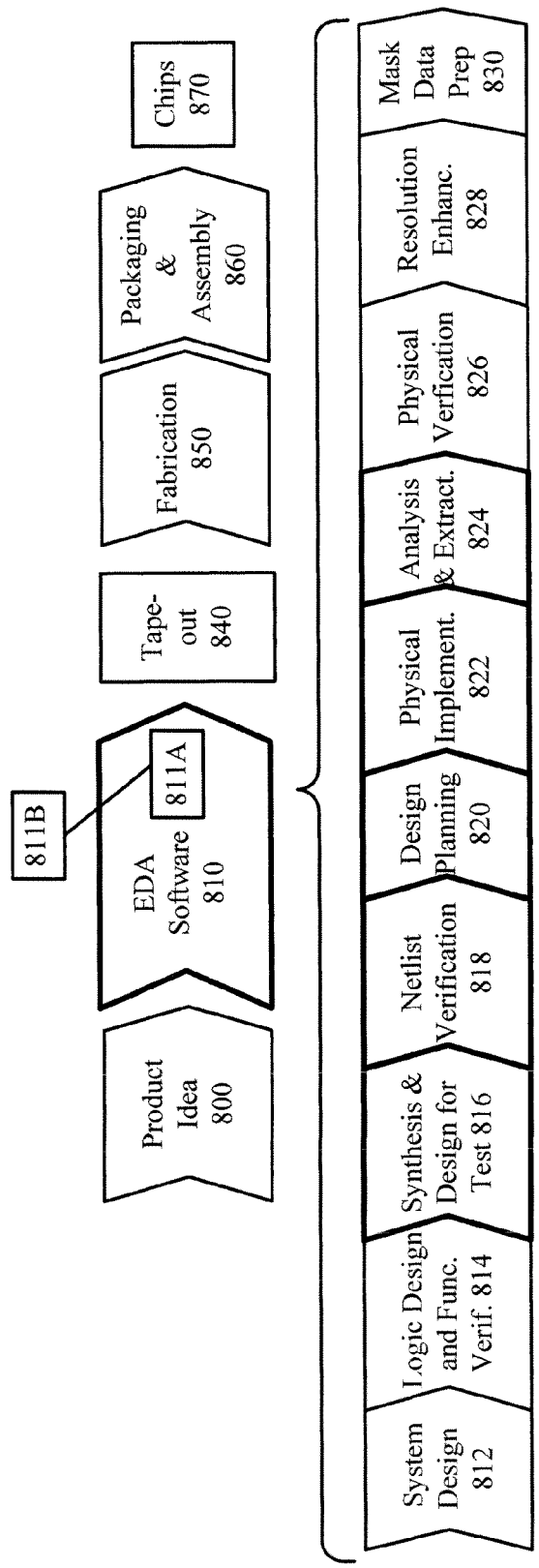
FIG. 8 shows a simplified representation of an exemplary digital Application Specific Integrated Circuit (ASIC) design flow that can use the above-described energy-sensitive model.

FIG. 8 shows a simplified representation of an exemplary digital Application Specific Integrated Circuit (ASIC) design flow that can use the above-described energy-sensitive model. At a high level, the process starts with the product idea (step 800) and is realized in an Electronic Design Automation (EDA) software design process (step 810). When the design is finalized, it can be taped-out (event 840). After tape out, the fabrication process (step 850) and packaging and assembly processes (step 860) occur resulting, ultimately, in finished chips (result 870).

The EDA software design process (step 810) is actually composed of a number of steps 812-830, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components/steps of the EDA software design process (step 810) will now be provided. In one embodiment, one or more steps of the EDA software design process can be implemented using a non-transitory computer-readable medium 811A, which is read by a computer 811B. Note that Astro, AstroRail, CustomSim, ESP, Hercules, IC Compiler, Magellan, Model Architect, Power Compiler, PrimeRail, Proteus, ProteusAF, PSMGen, Saber, StarRC, and System Studio are trademarks of Synopsys, Inc., and CATS, DesignWare, Design Compiler, Formality, HSIM, Leda, NanoSim, Primetime, Syndicated, TetraMAX, VCS, and Vera are registered trademarks of Synopsys, Inc. System design (step 812): The designers describe the functionality that they want to implement. They can perform what-if planning to refine functionality, check costs, etc. Hardware-software architecture partitioning can occur at this stage. Exemplary EDA software products from Synopsys, Inc. that can be used at this step include Model Architect™, Saber™, System Studio™, and DesignWare® products.

Logic design and functional verification (step 814): At this stage, the VHDL or Verilog code for modules in the system is written and the design is checked for functional accuracy. More specifically, the design is checked to ensure that it produces the correct outputs. Exemplary EDA software products from Synopsys, Inc. that can be used at this step include HSIM®, NanoSim®, CustomSim™, VCS®, VERA®, DesignWare®, Magellan™, Formality®, ESP and LEDA® products.

Synthesis and design for test (step 816): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Power Compiler™, Tetramax®, and DesignWare® products.

Netlist verification (step 818): At this step, the netlist is checked for compliance with timing constraints and for correspondence with the VHDL/Verilog source code. Exemplary EDA software products from Synopsys, Inc. that can be used at this step include Formality®, PrimeTime™, and VCS® products.

Design planning (step 820): Here, an overall floorplan for the chip is constructed and analyzed for timing and top-level routing. Exemplary EDA software products from Synopsys, Inc. that can be used at this step include Astro™ and IC Compiler™ products.

Physical implementation (step 822): The placement (positioning of circuit elements) and routing (connection of the same) occurs at this step. Exemplary EDA software products from Synopsys, Inc. that can be used at this step include the Astro and IC Compiler™ products.

Analysis and extraction (step 824): At this step, the circuit function is verified at a transistor level, which in turn permits what-if refinement. Exemplary EDA software products from Synopsys, Inc. that can be used at this step include AstroRail™, PrimeRail™, Primetime, and Star RC/XT™ products.

Physical verification (step 826): At this step various checking functions are performed to ensure correctness for manufacturing, electrical issues, lithographic issues, and circuitry. Exemplary EDA software products from Synopsys, Inc. that can be used at this step include the Hercules™ product.

Resolution enhancement (step 828): This step involves geometric manipulations of the layout to improve manufacturability of the design. Exemplary EDA software products from Synopsys, Inc. that can be used at this step include Proteus™, ProteusAF™, PSMGen™, and ProGen™ products. In one embodiment, the energy-sensitive compact model can be included in the ProGen™ tool.

Mask data preparation (step 830): This step provides the "tape-out" data for production of masks for lithographic use to produce finished chips. Exemplary EDA software products from Synopsys, Inc. that can be used at this step include the CATS® family of products.

The energy-sensitive compact model can be implemented advantageously in one or more computer programs that execute on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors, as well as other types of micro-controllers. Generally, a processor will receive instructions and data from a read-only memory and/or a random access memory. Generally, a computer will include one or more mass storage devices for storing data files; such devices include magnetic disks, such as internal hard disks and removable disks, magneto-optical disks, and optical disks. Storage devices suitable for tangibly embodying computer program instructions and data include all forms of non-volatile memory, including by way of example semiconductor memory devices, such as EPROM, EEPROM, and flash memory devices, magnetic disks such as internal hard disks and removable disks, magneto-optical disks, and CDROM disks. Any of the foregoing can be supplemented by, or incorporated in, ASICs.

The various embodiments of the structures and methods of the energy-sensitive compact model that are described above are illustrative only of the principles of this energy-sensitive compact model technique and are not intended to limit the scope of the invention to the particular embodiments described such as Design For Manufacturing (DFM) applications. Thus, the invention is limited only by the following claims and their equivalents.

The invention claimed is:

1. A method of calibrating a compact model for a lithographic process, the method comprising:
   getting the compact model;
   separating an input energy effect from chemical effects and other factors regarding a photoresist; and
   using a processor, calibrating the compact model based on an input energy, thereby generating an energy-sensitive compact model.

2. The method of claim 1, further including:
   calibrating the energy-sensitive compact model based on one or more of the chemical effects.

3. The method of claim 1, further including:
   calibrating the energy-sensitive compact model based on one or more of the other factors.

4. The method of claim 1, further including:
   calibrating the energy-sensitive compact model based on one or more of the chemical effects, and on one or more of the other factors.

5. The method of claim 4, wherein said calibrating the energy-sensitive compact model based on the one or more of the chemical effects includes calibrating the energy-sensitive compact model based on whether the photoresist is positive resist or negative resist.

6. The method of claim 4, wherein said calibrating the energy-sensitive compact model based on the one or more of the chemical effects includes calibrating the energy-sensitive compact model based on whether chemical amplification is used.

7. The method of claim 4, wherein said calibrating the energy-sensitive compact model based on the one or more of the other factors includes calibrating the energy-sensitive compact model based on a usable depth of focus.

8. The method of claim 4, wherein said calibrating the energy-sensitive compact model based on the one or more of the other factors includes calibrating the energy-sensitive compact model based on whether soft-bake is performed.

9. The method of claim 4, wherein said calibrating the energy-sensitive compact model based on the one or more of the other factors includes calibrating the energy-sensitive compact model based on whether post-exposure bake is performed.

10. The method of claim 4, wherein said calibrating the energy-sensitive compact model based on the one or more of the other factors includes calibrating the energy-sensitive compact model based on a rate of solvent evaporation.

11. A non-transitory, computer-readable medium storing computer-executable instructions for calibrating a compact model for a lithographic process, which when executed by a processor perform steps comprising:
    getting the compact model;
    separating an input energy effect from chemical effects and other factors regarding a photoresist; and
    calibrating the compact model based on an input energy, thereby generating an energy-sensitive compact model.

12. The computer-readable medium of claim 11, further including:
    calibrating the energy-sensitive compact model based on one or more of the chemical effects.

13. The computer-readable medium of claim 11, further including:
    calibrating the energy-sensitive compact model based on one or more of the other factors.

14. A system including a processor, with the processor being configured to perform steps comprising:
    getting a compact model;
    separating an input energy effect from chemical effects and other factors regarding a photoresist; and
    using the processor, calibrating the compact model based on an input energy, thereby generating an energy-sensitive compact model.

15. The system of claim 14, wherein the processor is further configured to perform:
    calibrating the energy-sensitive compact model based on one or more of the chemical effects.

16. The system of claim 14, wherein the processor is further configured to perform:
    calibrating the energy-sensitive compact model based on one or more of the other factors.

17. A method of using an energy-sensitive compact model for a lithographic tool, the method comprising:
    getting the energy-sensitive compact model, the energy-sensitive compact model being calibrated separately for an input energy effect and chemical effects for a photoresist;
    getting a proposed photoresist pattern and an input energy; and
    using a processor, using the input energy and the energy-sensitive compact model to reconstruct a photoresist profile.

18. The method of claim 17, further including using the reconstructed photoresist profile to perform a subsequent processing step.

19. The method of claim 18, wherein the subsequent processing step includes one of identifying regions exhibiting unacceptable resist top loss or sidewall angle, providing area identification information to facilitate rigorous modeling or generating critical dimension scanning electron microscope images, and forming a three-dimensional image.

* * * * *